June 14, 1966 G. F. ROGERS 3,256,489

AMPLITUDE DEPENDENT ZERO SHIFT REDUCTION
FOR FREQUENCY DISCRIMINATORS

Filed Jan. 11, 1963 2 Sheets-Sheet 1

INVENTOR.
GORDON F. ROGERS
BY
George T. Craig
ATTORNEY

INVENTOR.
GEORGE F. ROGERS
BY
George T. Craig
ATTORNEY 3,256,489

AMPLITUDE DEPENDENT ZERO SHIFT REDUCTION FOR FREQUENCY DISCRIMINATORS

Gordon F. Rogers, Moorestown, N.J., assignor to Radio Corporation of America, a corporation of Delaware Filed Jan. 11, 1963, Ser. No. 250,904
4 Claims. (Cl. 329—138)

Figures 1, 1A, 1B:
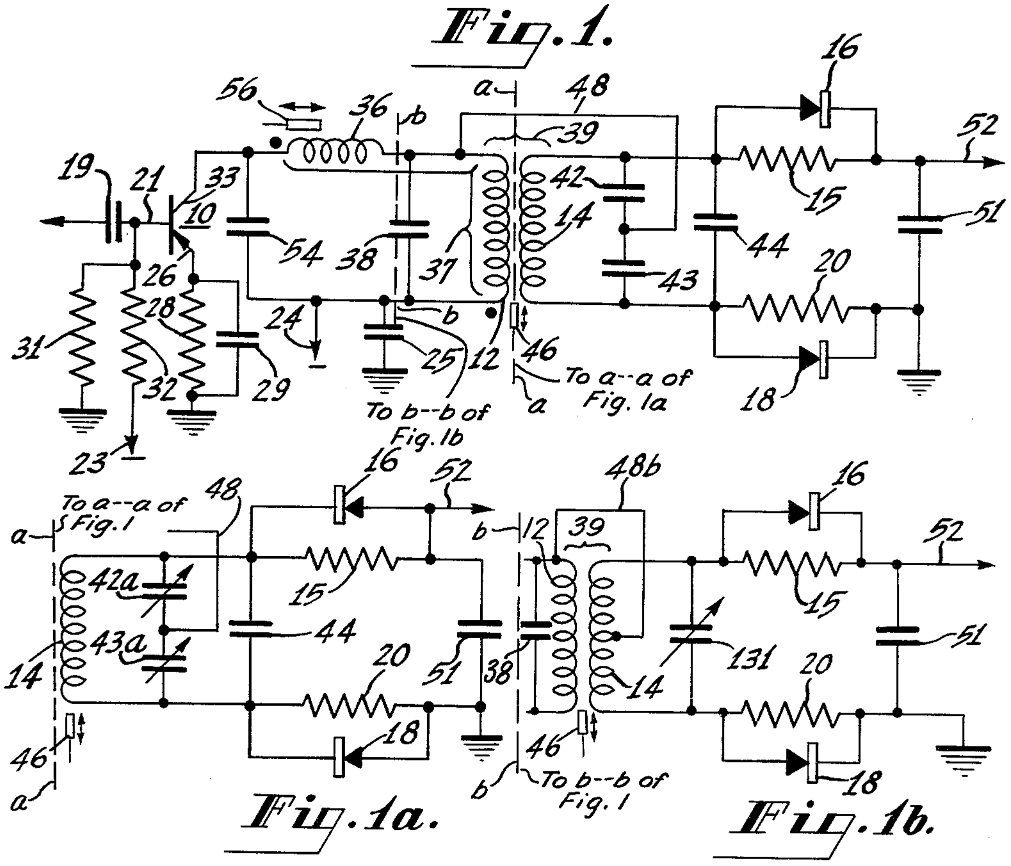

The present invention relates to frequency detectors or discriminators, and more particularly to novel means for reducing shift of frequency at which the output response is zero.

A frequency discriminator provides an output signal representing the modulating signal which modulates a carrier by an angle modulating process, for example, by a phase or frequency modulating process. A discriminator is adjusted so that a constant input frequency produces no output signal. This may be referred to as the zero voltage point of the discriminator and the discriminator is adjusted so that the zero voltage point corresponds with the mean or center frequency of a modulated carrier applied to the discriminator or demodulation. In known discriminators, there is a zero voltage point shift when the level of the input signal changes.

An object of the present invention is to provide a frequency discriminator circuit in which shift of the zero voltage point with changes in input signal level is substantially eliminated.

A further and related object of the present invention resides in the provision of a novel combination of a filter to remove radio frequency harmonic distortion and a discriminator in a frequency discriminator circuit for substantially eliminating shift of the zero voltage point with changes in input signal level.

A still further object of the present invention is to provide a novel discriminator transformer incorporating a filter coil.

It is thus a still further object of the invention to provide a means of preventing any harmonics present across the input of a frequency discriminator from being applied to the diode rectifiers thereof.

In accordance with the present invention, the angle modulated signal is supplied to the demodulating portion of a frequency discriminator by way of a filter which removes radio frequency harmonic distortion introduced by the amplifier or limiter stage or stages ahead of the discriminator. A conventional discriminator has a zero voltage point which shifts when the harmonic distortion in the input signal changes with level due to a variation in the just-mentioned distortion introduced by the amplifier or limited prior to demodulation. This shift in the zero voltage point is caused by discriminator unbalance produced by input signal distortion.

In the known Seeley discriminator, for example, of the type shown in Patent No. 2,121,103, the voltage applied to the diodes consists of the primary voltage plus one half of the secondary voltage. Due to tuned circuit action, the secondary voltage does not have the harmonic content present across the primary. One diode thus sees the primary voltage consisting of the fundamental and harmonic plus the secondary voltage consisting of only the fundamental but this fundamental being 90 degrees ahead of the fundamental in the primary. The other diode sees the same voltages except that the secondary voltage is 90 degrees behind the primary. The effect of the harmonic is to make the rectification efficiency different for the two diodes thus causing unbalance in the D.C. output even though the fundamental components applied to the two diodes are equal. It should be noted that using the opposite diode polarity for both diodes will usually either increase or decrease the unbalance from the harmonics.

Accurate alignment of the discriminator is made less difficult by following the teachings of the present invention. This is particularly helpful when the discriminator is to be aligned in the field where the input level may not be known. Also, by associating a filter with a discriminator as taught by the present invention receiver immunity to impulse noise is improved because the center frequency discriminator output is zero for all input levels.

Figure 2:
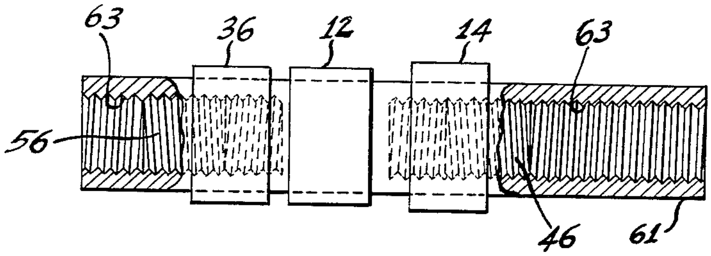
Figure 3:
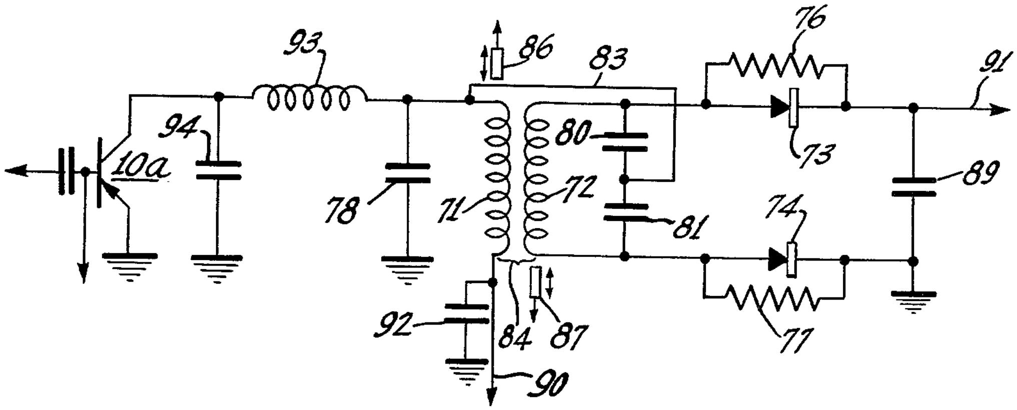
Figure 4:
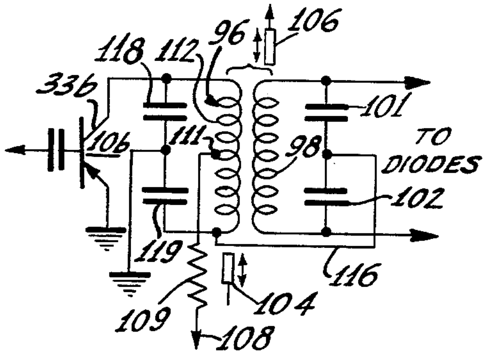
Figure 5:
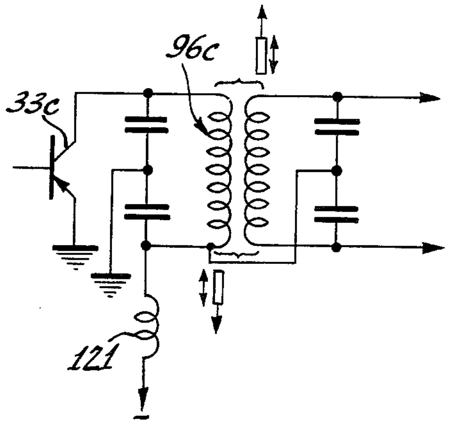

The invention will be described in greater detail by reference to the accompanying drawing in which:

FIGURE 1 is a schematic diagram of an amplifier-limiter and frequency discriminator embodying the present invention;

FIGURES 1*a* and 1*b* are schematic diagrams of modifications of the frequency discriminator of the present invention, including the limiter of FIGURE 1, as indicated by the lines *a—a* and *b—b*;

FIGURE 2 is a somewhat enlarged view in side elevation of a discriminator transformer of this invention including a filter coil for use in the discriminator circuit of FIGURE 1; and FIGURES 3, 4 and 5 are schematic diagrams of further modifications of the discriminator of the present invention.

Referring to FIGURE 1, a transistor 10 serves as the input stage for the discriminator comprising in part primary and secondary coils 12 and 14, respectively, and diode rectifiers 16 and 18. By way of example, the diodes 16 and 18 are type 1N67A. The diodes are shunted by load resistors 15 and 20. An input capacitor 19 serves to couple the base 21 of the transistor to preceding stages which may constitute the remaining portion of a superheterodyne receiver for the reception of frequency modulated waves.

The transistor 10, shown illustratively as being a PNP junction transistor, is biased by a voltage bias source (not shown) having its negative terminal connected to terminals 23 and 24. Bypass capacitor 25 serves the usual purpose. By way of example, the transistor 10 is type 2N1180. The positive terminal of the voltage bias source is connected to a voltage reference point for the discriminator such, for example, as ground. The emitter 26 is biased in the forward direction with respect to the base 21 by a connection to ground by way of a resistor 28 shunted by a capacitor 29. Negative bias is maintained on the base 21 by a voltage divider composed of resistors 31 and 32 connected between ground and the negative terminal of the voltage bias source. The collector 33 is biased in the reverse direction with respect to the base from the terminal 24 through the primary coil 12 and a filter coil 36. The function of the filter coil will be more fully described. The filter coil 36 is inductively coupled to the primary coil 12 as indicated by the brace symbol 37. The secondary coil 14 is inductively coupled to the primary coil 12 as indicated by the brace symbol 39, and therefore, all three coils are inductively coupled.

A capacitor 38 is connected in parallel with the primary coil 12. The secondary coil is shunted by capacitors 42 and 43 connetced in series to provide the secondary resonant circuit of the discriminator. The secondary resonant circuit is tuned by varying the inductance value of the secondary coil by an adjustable powdered iron core 46 (FIGURES 1 and 2). The high potential end of the primary coil 12 is connected by a conductor 48 to the junction of capacitors 42 and 43. This will result in establishing the junction point at the same alternating potential as the high potential side of the primary circuit. A capacitor 44 may be employed to provide temperature compensation.

The anodes of the rectifiers 16 and 18, shown by way of example as semiconductor devices, are connected to the ends of the secondary coil 14. The cathodes of the diodes are connected by a capacitor 51 and the cathode of diode 18 and one terminal of the capacitor 51 are connected to ground. Voltages produced by the rectification of signal currents are developed across the diode load resistors 15 and 20 and are differentially added to provide an output signal voltage on a conductor 52. This output signal voltage may be supplied to an amplifier by way of the usual deemphasis filter.

For a given frequency of the input carrier signal to the discriminator, the output signal voltage is zero. This may be termed the zero voltage point of the discriminator. Without benefit of the present invention, there is a shift in the zero voltage point with a change in signal input level to the discriminator under circuit conditions when the signal across the primary 12 contains harmonic distortion. This harmonic distortion may be due to the plate current waveform with a tube (not shown) in the earlier stages of the receiver acting as a limiter or due to the collector current waveform of the transistor 10 or a preceding stage transistor. A further source of distortion with a transistor occurs when the collector current is increased and the collector voltage decreases to the point where collector bottoming or saturation occurs.

In accordance with the present invention, the harmonic voltage and other signal distortions are prevented from reaching the discriminator by a filter. The latter may be incorporated in the discriminator structure or be provided as a separate filter. By incorporating the filter in the discriminator, the arrangement is compact and space is saved. In FIGURE 1, the filter is a pi type filter and comprises the previously mentioned coil 36, a capacitor 54 and capacitor 38. A powdered iron core is adjustably insertable in the coil 36 and adjusted for pi circuit resonance taking into account the effect of the primary coil 12 in shunt with capacitor 38 and the mutual inductance between coils 36 and 12.

FIGURE 2 of the drawing illustrates an example of a physical arrangement of the schematic showing of FIGURE 1. By the arrangement of the circuit elements of FIGURE 1 as shown in FIGURE 2, the zero shift is in the neighborhood of 0.15 volt with the full range of input signal levels. The same reference characters used in FIGURE 1 are used in FIGURE 2 for corresponding parts. A tubular coil form 61 of insulating material of any kind suitable for supporting high frequency coils is internally threaded as indicated at 63 adjustably to receive the cores 46 and 56. The coils 12, 14 and 36 are disposed on the coil form in the order shown with the core 56 cooperating with the coil 36 and the core 46 cooperating with the coil 14. In the particular embodiment used, the coils 12 and 36 had an equal number of turns and there appeared to be no particular advantage in having more or less turns on coil 12 relative to relative coil 36. The number of turns on coil 14 is, as usual in discriminators, determined by practical factors such as the coupling between coils 12 and 14 and the selected capacitance effective to tune coil 14. The dots appearing on FIGURE 1 indicate that the coil 36 is connected opposite to the polarity of the coil 12. As indicated by the dots the voltage induced in coil 12 by the coil 36 is in phase with the voltage across capacitor 38. Changing the polarity of either coil requires more total resonating capacitance but does not change the zero shift characteristic or audio output for a given deviation.

By way of example, if the frequency of the input from the transistor 10 is 455 kc. (kilocycle) the capacitors of FIGURE 1 may have the following values:

| | | |
|---|---|---|
| Capacitor **19** | micromicrofarads | 1500 |
| Capacitor **29** | mfd | 0.1 |
| Capacitor **38** | micromicrofarads | 560 |
| Capacitor **42** | do | 220 |
| Capacitor **43** | do | 220 |
| Capacitor **44** | do | 24 |
| Capacitor **51** | do | 470 |
| Capacitor **54** | do | 560 |

Also, by way of example, the resistors may have the following values:

| | K ohms |
|---|---|
| Resistor **15** | 100 |
| Resistor **20** | 100 |
| Resistor **28** | 1.0 |
| Resistor **31** | 10 |
| Resistor **32** | 22 |

FIGURES 1*a* and 1*b* illustrate modifications of frequency discriminators embodying the present invention. Reference characters corresponding to the same parts in FIGURE 1 are used. In FIGURE 1*a* the polarity of the diodes is reversed. As pointed out in the foregoing, using the opposite polarity for both diodes may increase or decrease the unbalance from harmonics. In a given case, the polarity of the diodes may be selected so that their conduction is at a time when the primary circuit harmonics have the least effect upon diode conduction. This is advantageous if the filter associated with the discriminator as taught by the present invention is not properly adjusted to keep the harmonic voltage from being applied to the detector portion of the discriminator. However, with proper adjustment the zero shift of the discriminator can be made negligible.

Both FIGURES 1*a* and 1*b* indicate that the secondary circuit is tuned to resonance by varying the capacity in shunt to the coil. In FIGURE 1*a* this may be accomplished by the variable capacitors **42*a* and 43*a* or by adjusting both these capacitors and the core 46. If tuning is to be accomplished solely by the capacitors 42*a* and 43*a*, the core 46** may be omitted. FIGURE 1*b* shows a single variable capacitor 131 for tuning purposes and a tapped secondary to which the conductor **48*b*** is connected. As stated in connection with FIGURE 1*a*, a movable core 46 may be employed.

The modified discriminator circuit of FIGURE 3 is similar to FIG. 1 except that there is no magnetic coupling between the pi coil and the primary or secondary coils. The circuitry for the input transistor **10*a* is or may be substantially the same as shown in FIGURE 1. The discriminator comprises a primary coil 71, a secondary coil 72 and diode rectifiers 73 and 74. The latter are shunted by load resistors 76 and 77, respectively. A capacitor 78 is in shunt with the primary coil 71 and the secondary coil is shunted by series connected capacitors 80 and 81. A conductor 83 connects the high potential end of the primary coil to the junction of the capacitors 80 and 81. The primary and secondary are inductively coupled as indicated at 84. Powdered iron cores 86 and 87 tune the primary and secondary, respectively. The cathodes of the rectifiers 73 and 74 are connected by a capacitor 89 and the cathode of the rectifier 74 is grounded. Transistor bias is applied at a terminal 90 over a direct current path including the coils 71 and a filter coil 93. A bypass capacitor discriminator output appears at the terminal 91**.

Harmonic distortion is prevented from reaching the discriminator primary coil by a pi filter composed of the coil 93, a capacitor 94 and the capacitor 78. In FIGURE 3, the coil is not inductively coupled to either of the coils 71 or 72.

FIGURE 4 shows a modification of the invention in which a coil 96 serves the dual purpose of the discriminator primary coil and the inductance of the pi filter network. The transistor **10*d* is or may be connected to the bias voltage supply as described below and coupled to preceding stages in the manner pointed out above in the description of FIGURE 1. An input capacitor 19*d*, as in FIGURE 1, serves to couple the base 21*d* of transistor 10*d* to preceding stages. In addition to the primary coil 96, the discriminator includes a secondary coil 98, series connected capacitors 101 and 102 and the tuning cores 104 and 106. Bias voltage for the collector 33*b* of the transistor 10*b* is applied at a terminal 108. The direct current bias path includes a resistor 109, a tap 111 on the coil 96 and the portion 112 of the primary coil lying between the tap and the end of this coil. The base 21*d* is biased negatively by a voltage divider composed of resistors 31*d* and 32*d***.

The end of the coil 96 opposite its connection to the collector **33*b* is connected by a conductor 116 to the junction of the capacitors 101 and 102. The primary voltage supplied from this end of the coil 96 has a much lower harmonic content than when taken from the opposite end of the coil. The coil 96 is shunted by the series connected capacitors 118 and 119 to complete the pi configuration of the filter corresponding to the coil 36 and capacitors 54 and 38. The junction of the capacitors 118 and 119** is grounded as shown to complete the filter network.

FIGURE 5 shows a slight modification of the discriminator circuit of FIGURE 4 in which the coil **96*c* is not tapped and bias voltage is applied at the end of the coil opposite its connection to the transistor collector 33*c*. The bias supply connection includes a choke 121. The choke 121 may be replaced by a resistor having a larger value of resistance than the resistor 109**.

What is claimed is:

1. A frequency discriminator including a transformer for demodulating an angle modulated input signal to recover the original modulating signal, said transformer having inductively coupled primary and secondary windings, a tuning capacitor in parallel with said primary winding, a pair of series connected tuning capacitors in parallel with said secondary winding, means coupling one end of said primary winding to the junction of said pair of capacitors, means coupled to said secondary winding for providing a rectified output voltage, said output voltage being substantially zero when said input signal is unmodulated, adjustable means for varying the inductance of said secondary winding, a filter comprising a coil, said capacitor across said primary and a second capacitor, said coil being inductively coupled to said primary winding, adjustable means for varying the inductance of said coil, and circuit means including said coil to supply said angle modulated signal to said primary winding from a source of angle modulated signals, said second capacitor of said filter being in shunt to said source.

2. A frequency discriminator including a transformer for demodulating an angle modulated input signal to recover the original modulating signal, said transformer having inductively coupled primary and secondary windings, a tuning capacitor in parallel with said primary winding, a pair of series connected tuning capacitors in parallel with said secondary winding, means coupling one end of said primary winding to the junction of said pair of capacitors, a first diode rectifier having its anode connected to one end of said secondary winding, a second diode rectifier having its anode connected to the opposite end of said secondary winding, a load resistor in shunt with each of said rectifiers, means for providing a rectified output voltage which is the differential of the rectified voltages across said load resistors, said output voltage being substantially zero when said input signal is unmodulated, adjustable means for varying the inductance of said secondary winding, a filter comprising a coil, said capacitor across said primary winding and a second capacitor, said coil being inductively coupled to said primary winding, adjustable means for varying the inductance of said coil, and circuit means including said coil to supply said angle modulated signal to said primary winding from a source of angle modulated signals, said second capacitor of said filter being in shunt to said source.

3. A frequency discriminator including a transformer for demodulating an angle modulated input signal to recover the original modulating signal, said transformer having inductively coupled primary and secondary windings, a tuning capacitor in parallel with said primary winding, a pair of series connected tuning capacitors in parallel with said secondary winding, means coupling one end of said primary winding to the junction of said pair of capacitors, a first diode rectifier having its cathode connected to one end of said secondary winding, a second diode rectifier having its cathode connected to the opposite end of said secondary winding, a load resistor in shunt with each of said rectifiers, means for providing a rectified output voltage which is the differential of the rectified voltages across said load resistors, said output voltage being substantially zero when said input signal is unmodulated, adjustable means for varying the inductance of said secondary winding, a filter comprising a coil, said capacitor across said primary winding and a second capacitor, said coil being inductively coupled to said primary winding, adjustable means for varying the inductance of said coil, and circuit means including said coil to supply said angle modulated signal to said primary winding from a source of angle modulated signals, said second capacitor of said filter being in shunt to said source.

4. A frequency discriminator including a transformer for demodulating an angle modulated input signal to recover the original modulating signal, said transformer having inductively coupled primary and secondary windings, a tuning capacitor in parallel with said primary winding, a pair of series connected tuning capacitors in parallel with said secondary winding, means coupling one end of said primary winding to the junction of said pair of capacitors, means coupled to said secondary winding for providing a rectified output voltage, said output voltage being substantially zero when said input signal is unmodulated, adjustable means for varying the inductance of said secondary winding, a filter comprising a coil and said capacitor in parallel with said primary winding and a second capacitor, said coil being inductively coupled to said primary winding with said coil in a polarity sense opposite to that of said primary winding requiring a minimum value of said tuning capacitor as compared to the value required should said coil and primary winding be in the same polarity sense, adjustable means for varying the inductance of said coil, and circuit means including said coil to supply said angle modulated signal to said primary winding from a source of angle modulated signals, said second capacitor of said filter being in shunt to said source.

References Cited by the Examiner

UNITED STATES PATENTS

| | | | |
|---|---|---|---|
| 2,341,937 | 2/1944 | Maynard | 329—138 |
| 2,410,983 | 11/1946 | Koch | 329—138 |
| 2,497,840 | 2/1950 | Seeley | 329—131 |
| 2,520,480 | 8/1950 | Tellier | 329—134 |
| 2,540,813 | 2/1951 | Dome | 329—131 |
| 2,589,236 | 3/1952 | Earp | 329—134 |

HERMAN KARL SAALBACH, *Primary Examiner.*

ALFRED L. BRODY, P. L. GENSLER, *Assistant Examiners.*